United States Patent
Kuboshima

(10) Patent No.: US 11,356,104 B2
(45) Date of Patent: Jun. 7, 2022

(54) PHASE LOCKED LOOP CIRCUIT

(71) Applicant: JVCKENWOOD Corporation, Yokohama (JP)

(72) Inventor: Ryo Kuboshima, Yokohama (JP)

(73) Assignee: JVCKENWOOD Corporation, Yokohama (JP)

( * ) Notice: Subject to any disclaimer, the term of this patent is extended or adjusted under 35 U.S.C. 154(b) by 0 days.

(21) Appl. No.: 17/351,300

(22) Filed: Jun. 18, 2021

(65) Prior Publication Data

US 2022/0006463 A1    Jan. 6, 2022

(30) Foreign Application Priority Data

Jul. 1, 2020   (JP) .............................. JP2020-114202

(51) Int. Cl.
    *H03L 7/097*   (2006.01)
    *H03L 7/093*   (2006.01)
    *H03L 7/189*   (2006.01)
    *H03L 7/099*   (2006.01)

(52) U.S. Cl.
    CPC .............. *H03L 7/097* (2013.01); *H03L 7/093* (2013.01); *H03L 7/099* (2013.01); *H03L 7/189* (2013.01)

(58) Field of Classification Search
    CPC ......... H03L 7/093; H03L 7/097; H03L 7/099; H03L 7/0992; H03L 7/16; H03L 7/18; H03L 7/189
    See application file for complete search history.

(56) References Cited

U.S. PATENT DOCUMENTS

| 8,004,327 B2 * | 8/2011 | Hongo | G01S 7/4008 |
| | | | 327/156 |
| 2003/0016163 A1 * | 1/2003 | Isaji | G01S 7/35 |
| | | | 342/70 |
| 2010/0090731 A1 * | 4/2010 | Casagrande | H03C 3/0925 |
| | | | 327/148 |

FOREIGN PATENT DOCUMENTS

JP          05-327490         12/1993

* cited by examiner

*Primary Examiner* — Diana J. Cheng
(74) *Attorney, Agent, or Firm* — Amin, Turocy & Watson, LLP

(57) ABSTRACT

A phase locked loop circuit includes a phase comparator that compares phases of a reference signal through a first frequency divider and a local signal through a second frequency divider to output a phase comparison signal; a loop filter that smooths the phase comparison signal to output the control voltage signal; a controller that sets frequency division ratios of the first and the second frequency dividers; a free-running voltage generator that generates a free-running voltage signal of the voltage control oscillator; a measurement circuit that measures a voltage of the control voltage signal; a storage circuit that stores therein the voltage of the control voltage signal; and a low-pass filter that transmits, to the voltage control oscillator, a corrected free-running voltage signal based on a free-running voltage correction value calculated by the free-running voltage generator based on the control voltage signal before the frequency division ratios are changed.

2 Claims, 5 Drawing Sheets

PHASE LOCKED LOOP CIRCUIT

CROSS-REFERENCE TO RELATED APPLICATION

This application claims priority from Japanese Application No. 2020-114202, filed on Jul. 1, 2020, the contents of which are incorporated by reference herein in its entirety.

FIELD

The present application relates to a phase locked loop circuit.

BACKGROUND

In a phase locked loop (PLL) circuit, in general, characteristics (steady-state characteristics) observed after an output frequency of a voltage control oscillator enters a steady state and pull-in characteristics (locking characteristics) observed until a phase lock with a reference frequency signal occurs are in a conflicting relationship. For example, it is known that, if a frequency pull-in range of the locking characteristics is extended and a locking speed is increased, a noise band of a loop is extended and the characteristics in the steady state are degraded. Therefore, as the PLL circuit, it is desired to reduce a lockup time before an oscillation frequency of the voltage control oscillator is pulled in the reference frequency signal and the phase lock occurs.

Japanese Laid-open Patent Publication No. H5-327490 discloses a technology in which a voltage supply means by a free-running frequency control is provided for reducing the lockup time. In the technology, a fixed control voltage for determining the free-running frequency is stored in advance in addition to a variable control voltage that is output from a loop filter that controls a phase variation within a certain range of an oscillation frequency of a voltage control oscillator, and when changing the free-running frequency from a certain frequency to a different frequency, the fixed control voltage is changed.

However, it is often the case that a supplied control voltage and a control voltage in an actually locked state do not match with each other due to a characteristic (an individual difference) of the voltage control oscillator, and a lockup time increases as the difference in the voltage increases.

SUMMARY

A phase locked loop circuit is disclosed.

According to one aspect, there is provided a phase locked loop circuit comprising: a phase comparator configured to compare a phase of a reference signal and a phase of a local signal, the reference signal being obtained by dividing, by a first frequency divider, a signal of a reference frequency oscillated by a reference oscillator, the local signal being obtained by dividing, by a second frequency divider, a signal of a local frequency oscillated by a voltage control oscillator based on a control voltage signal, and to output a phase comparison signal corresponding to a phase difference therebetween; a loop filter configured to smooth the phase comparison signal and to output the control voltage signal; a controller configured to set a frequency division ratio of the first frequency divider and a frequency division ratio of the second frequency divider; a free-running voltage generator configured to generate a free-running voltage signal of the voltage control oscillator; a measurement circuit configured to measure a voltage of the control voltage signal; a storage circuit configured to store therein the voltage of the control voltage signal; and a low-pass filter configured to transmit a corrected free-running voltage signal to the voltage control oscillator, the corrected free-running voltage signal being obtained, by the free-running voltage generator, by adding a free-running voltage correction value to a voltage value of the free-running voltage signal, the free-running voltage correction value being calculated based on a voltage value of the control voltage signal stored in the storage circuit before the frequency division ratios are changed.

The above and other objects, features, advantages and technical and industrial significance of this application will be better understood by reading the following detailed description of presently preferred embodiments of the application, when considered in connection with the accompanying drawings.

DETAILED DESCRIPTION OF THE PREFERRED EMBODIMENTS

Embodiments of the present application will be described in detail below based on drawings. The present application is not limited by embodiments described below. Further, constituent elements described in the embodiments below include one that can easily be replaced by a person skilled in the art and one that is practically identical.

Configuration

Figure 1:
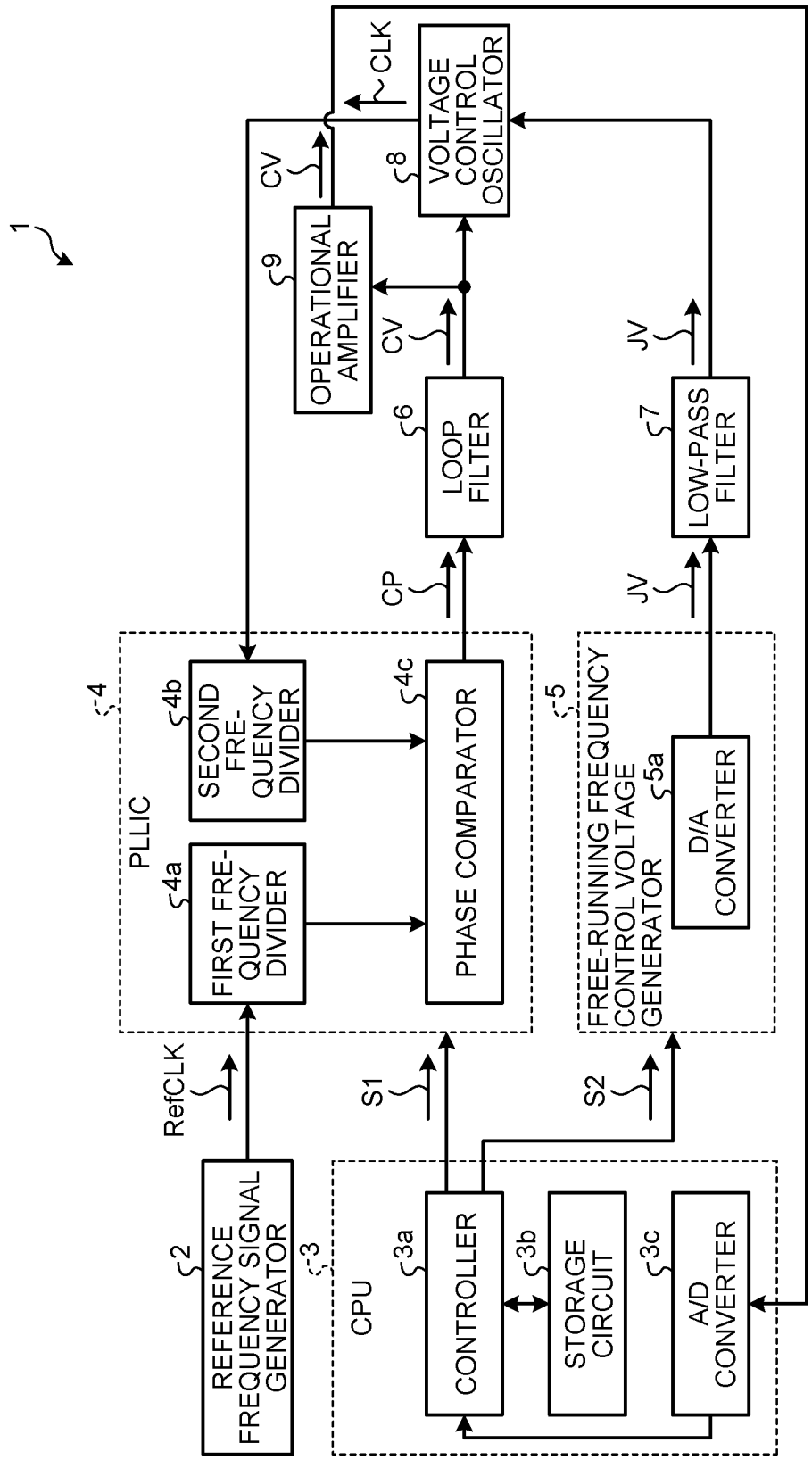
FIG. 1 is a diagram illustrating a configuration of a PLL circuit according to one embodiment.

FIG. 1 is a diagram illustrating a configuration a phase locked loop circuit (PLL circuit) according to one embodiment. A PLL circuit 1 includes a reference frequency signal generator 2, a central processing unit (CPU) 3, a PLL integrated circuit (PLLIC) 4, a free-running frequency control voltage generator 5, a loop filter 6, a low-pass filter 7, a voltage control oscillator (VCO) 8, and an operational amplifier 9. The CPU 3 includes a controller 3a, a storage circuit 3b, and an analog-to-digital (A/D) converter 3c. The PLLIC 4 includes a first frequency divider 4a, a second frequency divider 4b, and a phase comparator 4c. The free-running frequency control voltage generator 5 includes a digital-to-analog (D/A) converter 5a.

The reference frequency signal generator 2 outputs a signal (Reference Clock: RefCLK) at a reference frequency to the first frequency divider 4a.

The reference frequency signal generator 2 is one example of a "reference oscillator" according to the present application.

The first frequency divider 4a outputs, to the phase comparator 4c, a reference signal that is obtained by dividing the frequency of the signal RefCLK by a frequency division ratio that is set by a control signal S1 output from the controller 3a.

The second frequency divider 4b outputs, to the phase comparator 4c, a local signal that is obtained by dividing a frequency of an oscillation signal CLK oscillated by the voltage control oscillator 8 by the frequency division ratio that is set by the control signal S1.

The phase comparator 4c compares a phase of the reference signal and a phase of the local signal, and outputs a phase comparison signal CP corresponding to a phase difference to the loop filter 6.

The loop filter 6 outputs a control voltage signal CV that is obtained by performing smoothing on the phase comparison signal to the voltage control oscillator 8 and the operational amplifier 9.

The D/A converter 5a in the free-running frequency control voltage generator 5 outputs a free-running voltage signal JV, which is set by a control signal S2 output from the controller 3a, to the low-pass filter 7.

The free-running frequency control voltage generator 5 corresponds to one example of a "free-running voltage generator" according to the present application. The free-running frequency means a frequency of a signal which is oscillated based on a predetermined control voltage by the voltage control oscillator 8 described later. The free-running voltage means a control voltage when the voltage control oscillator 8 oscillates at a predetermined frequency.

The low-pass filter 7 removes noise by causing the free-running voltage signal JV to pass through a low frequency band, and outputs the free-running frequency control voltage signal JV to the voltage control oscillator 8.

The voltage control oscillator 8 oscillates based on the control voltage signal CV and the free-running voltage signal JV, and outputs the oscillation signal CLK to the second frequency divider 4b.

The operational amplifier 9 operates as a buffer that outputs the control voltage signal CV to the A/D converter 3c.

The A/D converter 3c outputs, to the controller 3a, a digital value that is obtained by performing A/D conversion on the control voltage signal CV. The controller 3a stores the digital value in the storage circuit 3b. The storage circuit 3b may be a random access memory (RAM) or a rewritable non-volatile memory (for example, a flash memory (registered trademark)).

The A/D converter 3c corresponds to one example of a "measurement circuit" according to the present application.

Basic operation of the PLL circuit 1 will be described. The controller 3a, when causing the voltage control oscillator 8 to oscillate at a frequency $f_1$ that is designated from outside, outputs the control signal S1 to the PLLIC 4 and sets a frequency division ratio of each of the first frequency divider 4a and the second frequency divider 4b. At the same time, the controller 3a outputs the control signal S2 to the free-running frequency control voltage generator 5, and control the free-running frequency control voltage generator 5 to output a free-running voltage signal $JV_1$ for causing the voltage control oscillator 8 to oscillate at the frequency $f_1$.

Subsequently, the controller 3a outputs, when receiving an instruction to change the frequency $f_1$ to a frequency $f_2$, the control signal S1 for setting a frequency division ratio to change the frequency $f_1$ to the frequency $f_2$. At the same time, the controller 3a outputs the control signal S2 to the free-running frequency control voltage generator 5, and control the free-running frequency control voltage generator 5 to output a free-running voltage signal $JV_2$ for causing the voltage control oscillator 8 to oscillate at the frequency $f_2$. At this time, it is preferable that a timing at which the frequency division ratio of each of the first frequency divider 4a and the second frequency divider 4b is set and a timing at which the free-running voltage signal JV is changed are the same.

One Aspect of Subjects

Figure 2:
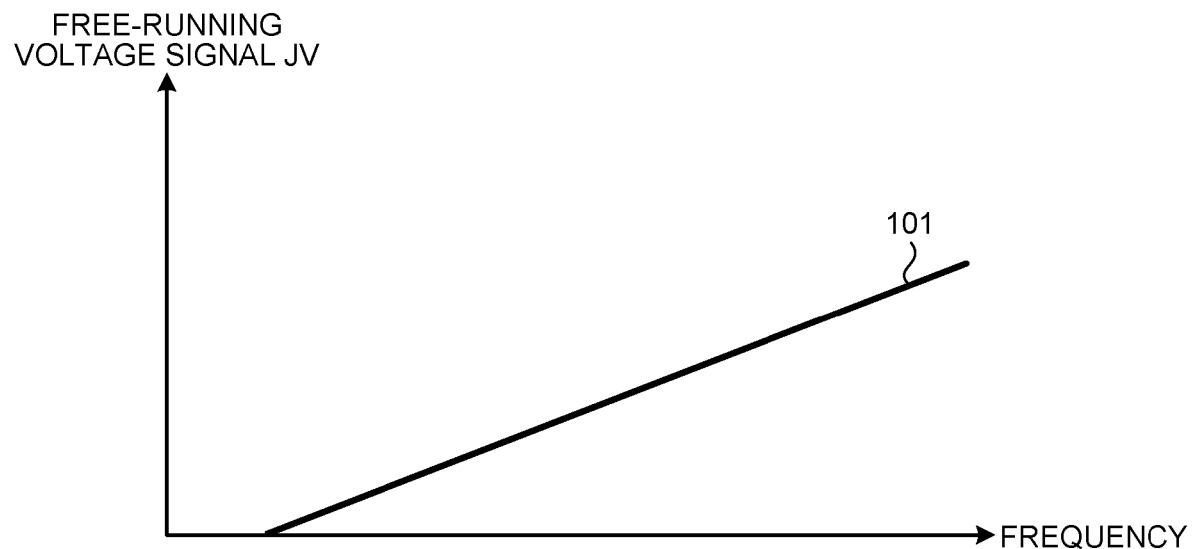
FIG. 2 is a diagram illustrating an ideal relationship between a free-running voltage signal and a frequency of an oscillation signal.

FIG. 2 is a diagram illustrating an ideal relationship between the free-running voltage signal and the frequency of the oscillation signal. As indicated by a line 101, ideally, it is desirable that a slope obtained by a relationship between the free-running voltage signal JV and the frequency of the oscillation signal CLK is constant, that is, the slope is linear.

Figure 3:
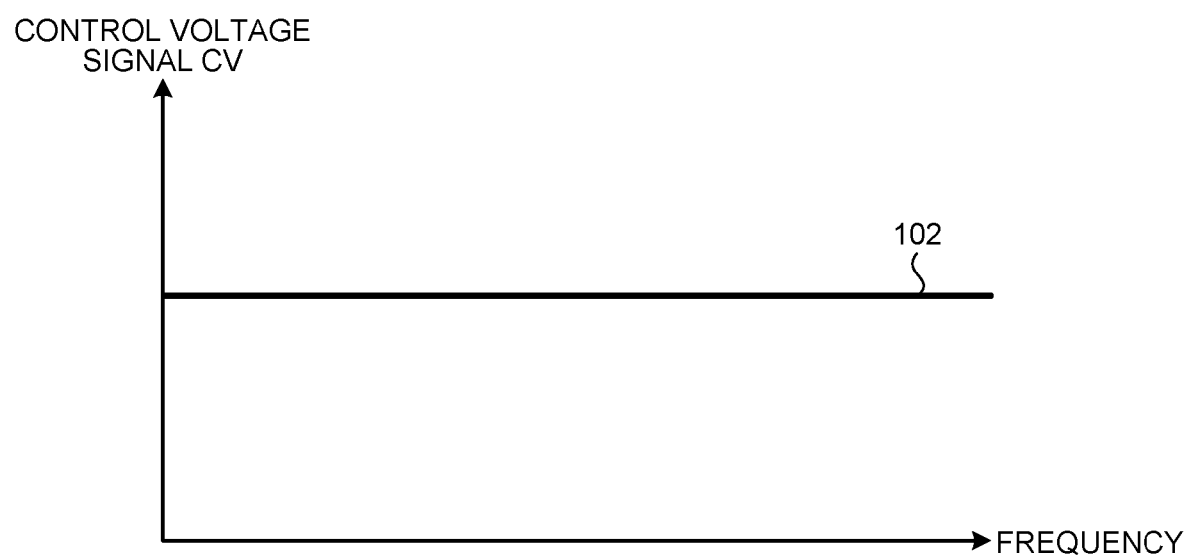
FIG. 3 is a diagram illustrating an ideal relationship between a control voltage signal and the frequency of the oscillation signal.

FIG. 3 is a diagram illustrating an ideal relationship between the control voltage signal and the frequency of the oscillation signal. As indicated by a line 102, ideally, it is desirable that the control voltage signal CV is constant regardless of the frequency of the oscillation signal CLK.

Figure 4:
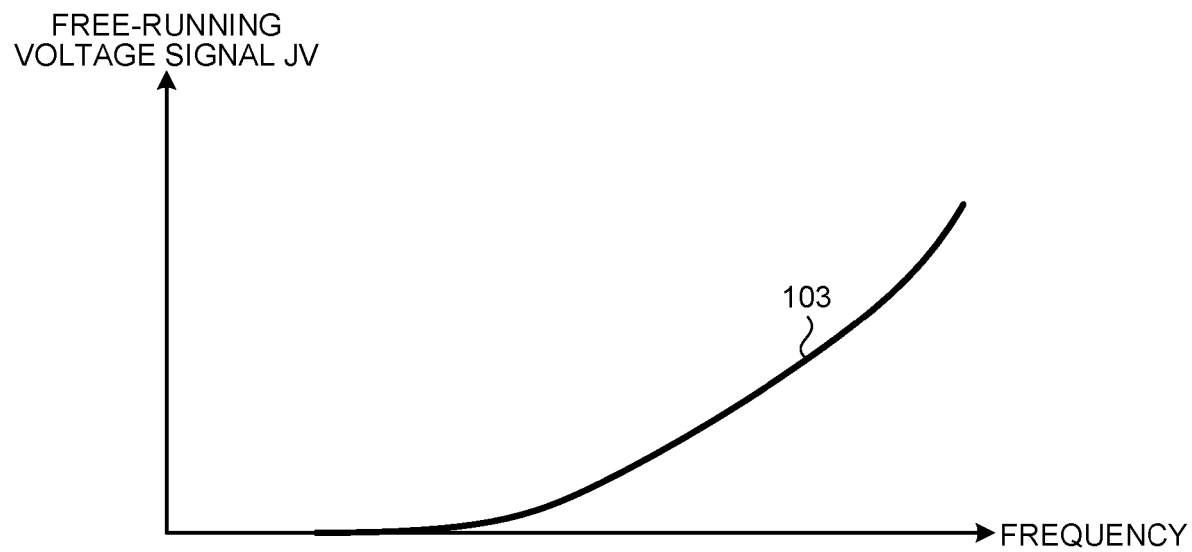
FIG. 4 is a diagram illustrating an example of an actual relationship between the free-running voltage signal and the frequency of the oscillation signal.

FIG. 4 is a diagram illustrating an example of an actual relationship between the free-running voltage signal and the frequency of the oscillation signal. As indicated by a line 103, actually, linearity is not achieved by the relationship between the free-running voltage signal JV and the frequency of the oscillation signal CLK. The linearity is not achieved because of a characteristic of a varactor diode inside the voltage control oscillator 8 or the like. However, in a region in which the voltage control oscillator 8 is used, a certain degree of the linearity is ensured.

Figure 5:
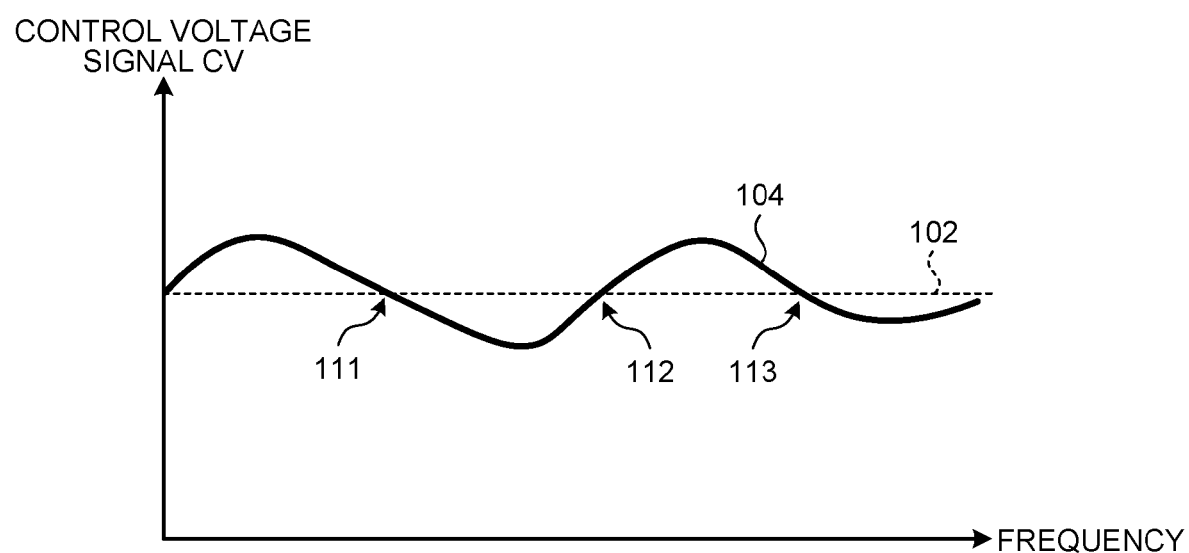
FIG. 5 is a diagram illustrating an example of an actual relationship between the control voltage signal and the frequency of the oscillation signal.

FIG. 5 is a diagram illustrating an example of an actual relationship between the control voltage signal and the frequency of the oscillation signal. As indicated by a line 104, actually, the control voltage signal CV is not constant depending on the frequency of the oscillation signal CLK. A point 111, a point 112, and a point 113 are points that are adjusted to match the ideal line 102 at the time of producing the PLL circuit 1. However, at points other than the point 111, the point 112, and the point 113, there are differences between the line 104 and the line 102. At the point 111, the point 112, and the point 113, a lockup time of the PLL circuit 1 is short. However, at the points other than the point 111, the point 112, and the point 113, the lockup time of the PLL circuit 1 is increased.

Figure 6:
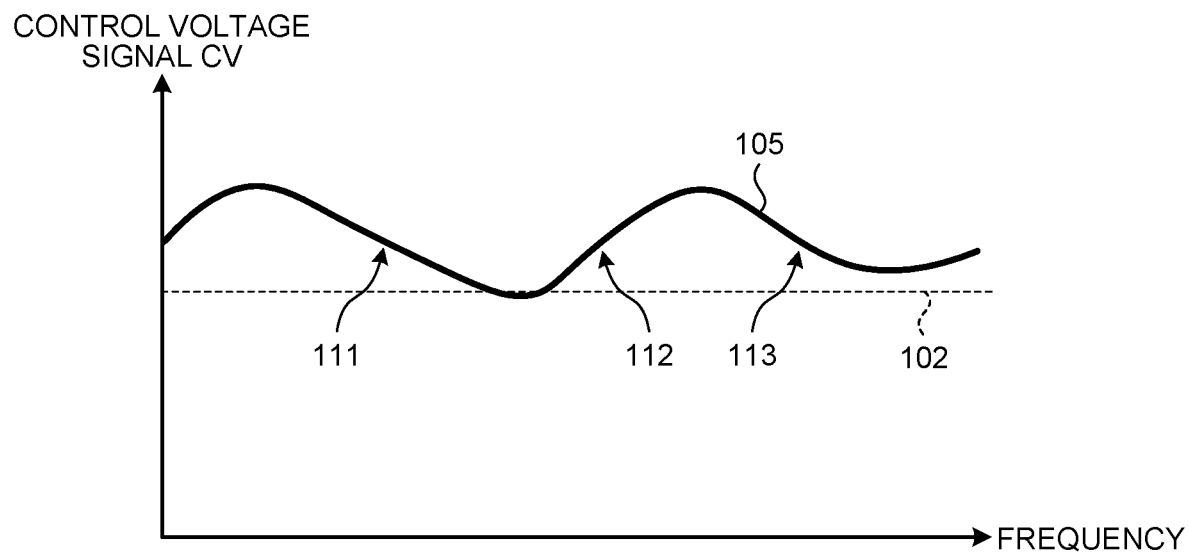
FIG. 6 is a diagram illustrating an example of an actual relationship between the control voltage signal and the frequency of the oscillation signal.

FIG. 6 is a diagram illustrating an example of an actual relationship between the control voltage signal and the frequency of the oscillation signal. More specifically, FIG. 6 is a diagram illustrating a state in which there is a difference between the ideal line 102 and an actual line 105 due to a temperature change in the PLL circuit 1. The line 105 is entirely shifted to an upper side in the figure as compared to the line 104 (see FIG. 5).

One Aspect of an Approach for Subjects

Figure 7:
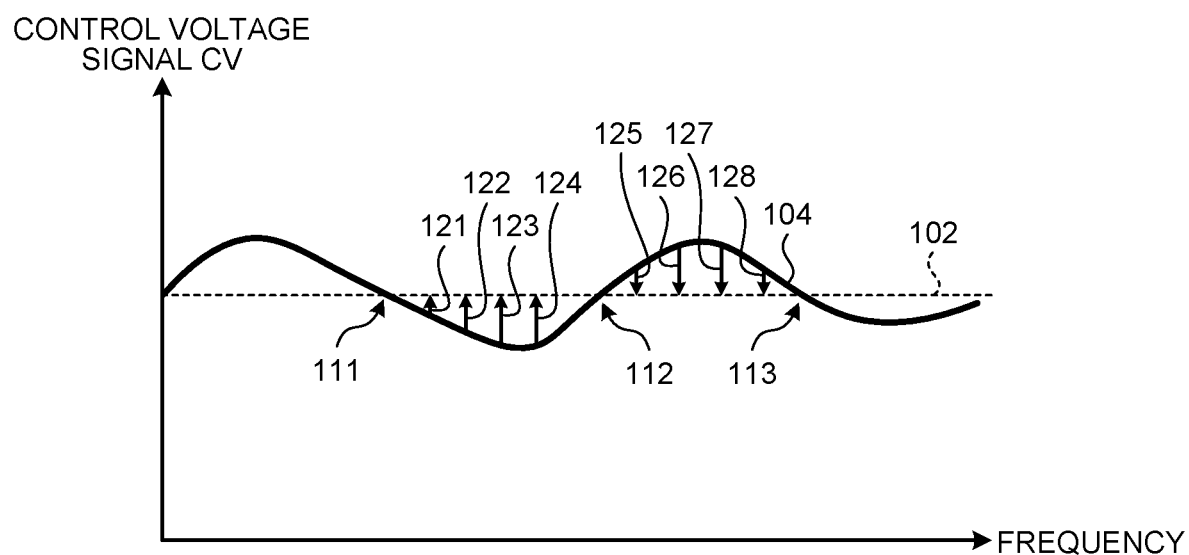
FIG. 7 is a diagram for explaining one aspect of an approach to solve a problem with the PLL circuit according to one embodiment.

FIG. 7 is a diagram for explaining one aspect of an approach to solve the problem with the PLL circuit according to the embodiment. The controller 3a offsets, as indicated by each of an arrow 121 to an arrow 128, the free-running voltage signal JV by a voltage (correction value ΔJV) corresponding to a difference between the line 104 and the line 102. Accordingly, it becomes possible to reduce the lockup time of the PLL circuit 1 even at the points other than the point 111, the point 112, and the point 113.

A calculation of the correction value ΔJV of the free-running voltage signal JV of the PLL circuit 1 will be described below.

A relationship between the control voltage signal CV and a frequency Freq oscillated by the voltage control oscillator 8 can be represented by Expression (1) below, where a frequency change amount of a voltage of the control voltage signal CV per 1 V is represented by CV sensitivity.

$$\text{Freq [MHz]} = \text{CV sensitivity [MHz/V]} \times \text{CV [V]} \quad (1)$$

A relationship between the free-running voltage signal JV and the frequency Freq can be represented by Expression (2) below, where a frequency change amount of a voltage of the free-running voltage signal JV per 1 V is represented by JV sensitivity.

$$\text{Freq [MHz]} = JV \text{ sensitivity [MHz/V]} \times JV \text{ [V]} \quad (2)$$

Therefore, when the actual voltage (see the line 104 in FIG. 7) has a difference with respect to the assumed voltage (see the line 102 in FIG. 7) of the control voltage signal CV, Expression (3) is obtained wherein the differential voltage is denoted by ΔCV.

$$\Delta\text{Freq [MHz]} = \text{CV sensitivity [MHz/V]} \times \Delta\text{CV [V]} \quad (3)$$

The correction value ΔJV for correcting ΔFreq in Expression (3) by the free-running voltage signal JV meets Expression (4) below.

$$\Delta\text{Freq [MHz]} = JV \text{ sensitivity [MHz/V]} \times \Delta JV \text{ [V]} \quad (4)$$

Expression (5) below is derived from Expression (3) and Expression (4).

$$\Delta JV \text{ [V]} = \text{CV sensitivity [MHz/V]} / JV \text{ sensitivity [MHz/V]} \times \Delta\text{CV [V]} \quad (5)$$

Therefore, the controller 3a is able to correct ΔCV by adding the correction value ΔJV calculated by Expression (5) to the free-running voltage signal JV to calculate a corrected free-running voltage signal $JV_{ADJ}$.

Consequently, it is possible to reduce the lockup time of the PLL circuit 1 at the points other than the point 111, the point 112, and the point 113.

Meanwhile, CV sensitivity and JV sensitivity may be set to different values depending on frequencies. Further, CV sensitivity and JV sensitivity may be represented by n-order functions (n is a natural number).

By performing the calculation of Expression (5) in an entire temperature range or an entire frequency range as specified in the PLL circuit 1, the controller 3a is able to reduce the lockup time in the entire temperature range or the entire frequency range as specified in the PLL circuit 1.

It is assumed that the controller 3a performs the calculation of Expression (5), but the present application is not limited to this example. The calculation of Expression (5) may be performed by the free-running frequency control voltage generator 5.

A Flow of Processes

Figure 8:
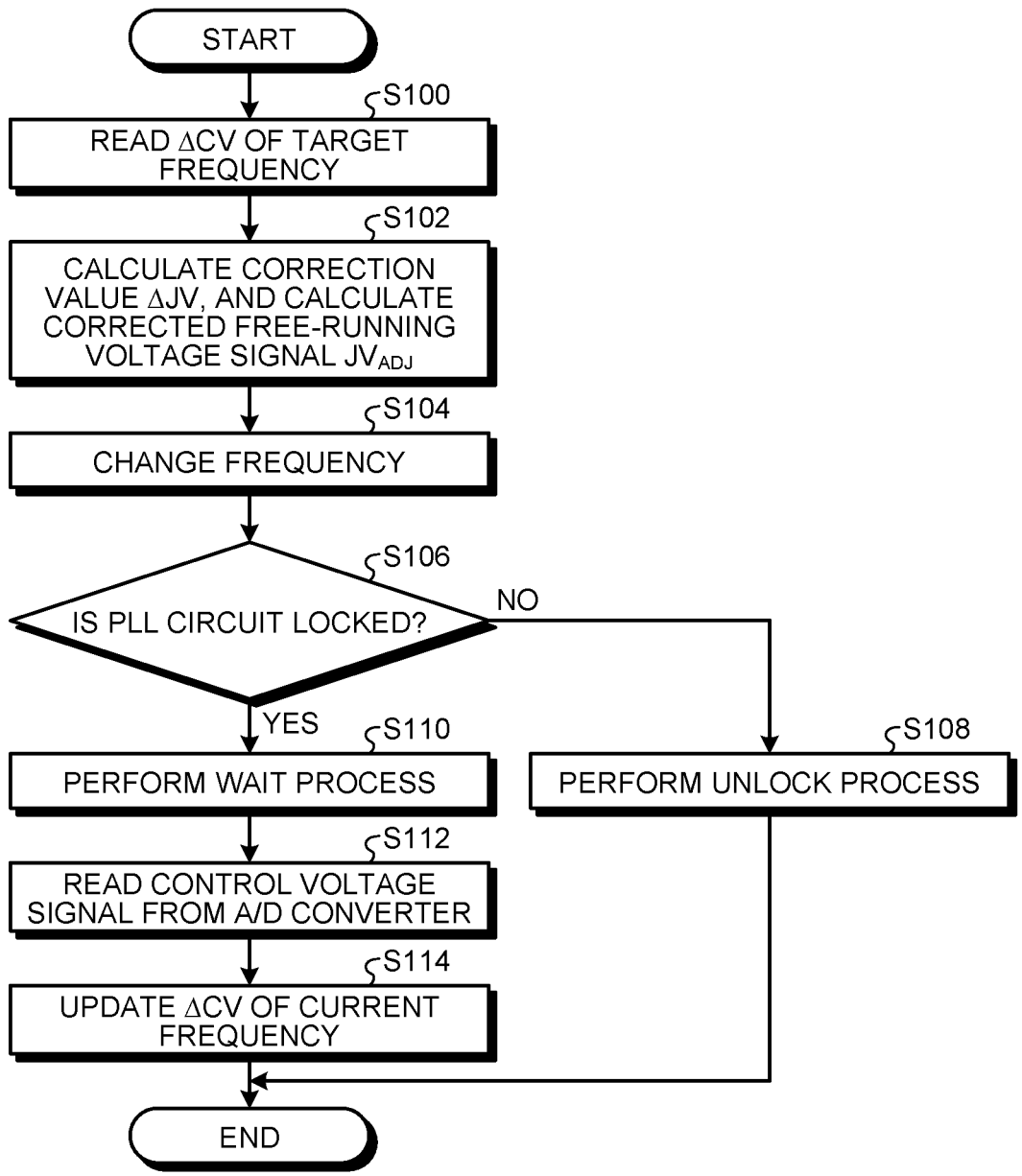
FIG. 8 is a flowchart illustrating processes of changing a frequency of the PLL circuit according to one embodiment.

FIG. 8 is a flowchart illustrating processes of changing the frequency of the PLL circuit according to one embodiment.

At Step S100, the controller 3a reads ΔCV of a target frequency from the storage circuit 3b. Meanwhile, ΔCV of the target frequency read at Step S100 has been stored in the storage circuit 3b at Step S114 described later in a previous flow of the flowchart for the target frequency. Further, in a first flow of the flowchart for the target frequency, ΔCV may be an initial value or a default value, for example.

At Step S102, the controller 3a calculates the correction value ΔJV by Expression (5). Further, the controller 3a adds the correction value ΔJV to the non-corrected free-running voltage signal JV of the target frequency, and calculates the corrected free-running voltage signal $JV_{ADJ}$.

At Step S104, the controller 3a changes the frequency. Specifically, as described above, the controller 3a outputs the control signal S1 for setting the frequency division ratios to the PLLIC 4. At the same time, the controller 3a outputs the control signal S2 to the free-running frequency control voltage generator 5 and causes the free-running frequency control voltage generator 5 to output the corrected free-running voltage signal $JV_{ADJ}$.

At Step S106, the controller 3a determines whether the PLL circuit 1 is locked. If the controller 3a determines that the PLL circuit 1 is not locked (No at Step S106), the controller 3a causes a process to proceed to Step S108. If the controller 3a determines that the PLL circuit 1 is locked (Yes at Step S106), the controller 3a causes the process to proceed to Step S110.

At Step S108, the controller 3a performs an unlock process. A state in which the PLL circuit 1 is not locked is an error state. Therefore, the controller 3a performs a well-known unlock process and thereafter terminates the processes.

At Step S110, the controller 3a performs a wait process. The wait process is a process to wait until the oscillation signal CLK is stabilized.

At Step S112, the controller 3a reads a digital value of the control voltage signal CV from the A/D converter 3c.

At Step S114, the controller 3a updates ΔCV of the current frequency (the target frequency) to store it in the storage circuit 3b, and terminates the processes.

One example of simple calculation Next, a simple calculation of CV sensitivity [MHz/V]/JV sensitivity [MHz/V] will be described.

Due to a performance error (individual difference) between circuit elements of the PLL circuit 1, an error occurs in CV sensitivity [MHz/V]/JV sensitivity [MHz/V].

To obtain CV sensitivity [MHz/V], it is necessary to measure an oscillation frequency while changing the control voltage signal CV. To obtain JV sensitivity [MHz/V], it is necessary to measure an oscillation frequency while changing the free-running voltage signal JV. When producing the PLL circuit 1, it is not easy to perform measurement as described above for all of the individual PLL circuits 1 in terms of preparation of measurement instruments, man-hours, and the like.

Thus, the controller 3a stores, in the storage circuit 3b, a control voltage signal $CV_1$ when the voltage control oscillator 8 is caused to oscillate by a certain free-running voltage signal $JV_1$. Subsequently, the controller 3a also stores, in the storage circuit 3b, another control voltage signal $CV_2$ when the voltage control oscillator 8 is caused to oscillate at a free-running voltage signal $JV_2$.

Expression (6) below is obtained, wherein an amount of change of the free-running voltage signal JV is represented by ΔJV change amount and an amount of change of the control voltage signal CV is represented by ΔCV measurement value.

$$\text{CV sensitivity [MHz/V]}/JV \text{ sensitivity [MHz/V]} = \Delta JV \text{ change amount}/\Delta CV \text{ measurement value} \quad (6)$$

Expression (7) is derived from Expression (5) and Expression (6).

$$\Delta JV \text{ [V]} = \Delta JV \text{ change amount}/\Delta CV \text{ measurement value} \times \Delta CV \text{ [V]} \quad (7)$$

Therefore, the controller 3a is able to calculate the correction value ΔJV by storing, in the storage circuit 3b, the two control voltage signals $CV_1$ and $CV_2$ when the voltage control oscillator 8 is caused to operate by the two free-running voltage signals $JV_1$ and $JV_2$.

With this configuration, it becomes not necessary to measure CV sensitivity [MHz/V] and JV sensitivity [MHz/V]. Therefore, it is possible to reduce the lockup time of all of the individual PLL circuits 1.

The controller 3a, when changing the frequency of the oscillation signal CLK from $f_1$ to $f_2$, sets an initial value of the free-running voltage signal $JV_2$ to a certain value with respect to the changed frequency $f_2$. However, the oscillation frequency caused by the free-running voltage signal $JV_2$ does not always match with the frequency $f_2$. To cope with this, the controller 3a stores the locked control voltage signal $CV_1$ before the frequency is changed and the locked control voltage signal $CV_2$ after the frequency is changed. Further, the controller 3a calculates a correction value $\Delta JV_2$ of the free-running voltage signal $JV_2$ based on a difference in the control voltage signal CV ($\Delta CV = CV_2 - CV_1$) and a difference in the free-running voltage signal JV ($\Delta JV = JV_2 - JV_1$). At a next change to the frequency $f_2$, the controller 3a is able to reduce the lockup time by correcting the free-running voltage signal $JV_2$ by the correction value $\Delta JV_2$.

By performing the calculation of Expression (7) in the entire temperature range or the entire frequency range as specified in the PLL circuit 1, the controller 3a is able to reduce the lockup time in the entire temperature range or the entire frequency range as specified in the PLL circuit 1.

It is assumed that the controller 3a performs the calculation of Expression (7), but the present application is not limited to this example. The calculation of Expression (7) may be performed by the free-running frequency control voltage generator 5.

According to the present application, it is possible to reduce the lockup time of the phase locked loop circuit.

Although the invention has been described with respect to specific embodiments for a complete and clear application, the appended claims are not to be thus limited but are to be construed as embodying all modifications and alternative constructions that may occur to one skilled in the art that fairly fall within the basic teaching herein set forth.

What is claimed is:

1. A phase locked loop circuit comprising:
a phase comparator configured to compare a phase of a reference signal and a phase of a local signal, the reference signal being obtained by dividing, by a first frequency divider, a signal of a reference frequency oscillated by a reference oscillator, the local signal being obtained by dividing, by a second frequency divider, a signal of a local frequency oscillated by a voltage control oscillator based on a control voltage signal, and to output a phase comparison signal corresponding to a phase difference therebetween;
a loop filter configured to smooth the phase comparison signal and to output the control voltage signal;
a free-running voltage generator configured to generate a free-running voltage signal of the voltage control oscillator;
a measurement circuit configured to measure a voltage of the control voltage signal;
a storage circuit configured to store therein the voltage of the control voltage signal; and
a low-pass filter configured to transmit the free-running voltage signal to the voltage control oscillator; and
a controller configured to:
set a frequency division ratio of the first frequency divider and a frequency division ratio of the second frequency divider;
calculate, based on a difference between a voltage value of the control voltage signal and a voltage value of an ideal control voltage signal, a free-running voltage correction value corresponding to the difference; and
set the free-running voltage signal corrected by the free-running voltage correction value in the free-running voltage generator.

2. The phase locked loop according to claim 1, wherein the controller is further configured to calculate the free-running voltage correction value based on a difference between the free-running voltage signals when the free-running voltage signal is changed and a difference between changes of the control voltage signals when the free-running voltage signal is changed.

* * * * *